United States Patent
Peng et al.

(10) Patent No.: US 12,341,098 B2
(45) Date of Patent: **\*Jun. 24, 2025**

(54) METAL PATTERNING FOR INTERNAL CELL ROUTING

(71) Applicant: Taiwan Semiconductor Manufacturing Company Limited, Hsinchu (TW)

(72) Inventors: Shih-Wei Peng, Hsinchu (TW); Chih-Liang Chen, Hsinchu (TW); Charles Chew-Yuen Young, Cupertino, CA (US); Hui-Ting Yang, Hsinchu (TW); Jiann-Tyng Tzeng, Hsinchu (TW); Wei-Cheng Lin, Taichung (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 880 days.

This patent is subject to a terminal disclaimer.

(21) Appl. No.: 17/463,768

(22) Filed: Sep. 1, 2021

(65) Prior Publication Data

US 2021/0398903 A1 Dec. 23, 2021

Related U.S. Application Data

(63) Continuation of application No. 16/852,604, filed on Apr. 20, 2020, now Pat. No. 11,133,255, which is a continuation of application No. 15/691,936, filed on Aug. 31, 2017, now Pat. No. 10,658,292.

(60) Provisional application No. 62/488,956, filed on Apr. 24, 2017.

(51) Int. Cl.
H01L 23/528 (2006.01)
H01L 23/532 (2006.01)

(52) U.S. Cl.
CPC ...... *H01L 23/5286* (2013.01); *H01L 23/5283* (2013.01); *H01L 23/53271* (2013.01)

(58) Field of Classification Search
CPC ......... H01L 23/49838; H01L 23/49844; H01L 23/5283; H01L 23/5286; H01L 23/53271
See application file for complete search history.

(56) References Cited

U.S. PATENT DOCUMENTS

| 4,700,212 | A | 10/1987 | Okazawa |
| 5,095,352 | A | 3/1992 | Noda et al. |
| 5,723,908 | A | 3/1998 | Fuchida et al. |
| 10,658,292 | B2* | 5/2020 | Peng ............ H01L 23/53271 |
| 11,133,255 | B2* | 9/2021 | Peng ............ H01L 23/5283 |
| 2012/0018720 | A1 | 1/2012 | Park et al. |

* cited by examiner

*Primary Examiner* — Michelle Mandala
*Assistant Examiner* — Kevin Quinto
(74) *Attorney, Agent, or Firm* — Jones Day

(57) ABSTRACT

A semiconductor device or structure includes a first pattern metal layer disposed between a first supply metal tract and a second supply metal tract, the first pattern metal layer comprising an internal route and a power route. A follow pin couples the first supply metal to the power route. The first supply metal tract comprises a first metal and a follow pin comprises a second metal.

20 Claims, 13 Drawing Sheets

METAL PATTERNING FOR INTERNAL CELL ROUTING

PRIORITY CLAIMS

The present application is a continuation application of U.S. application Ser. No. 16/852,604, filed Apr. 20, 2020, which is a continuation application of U.S. application Ser. No. 15/691,936, filed Aug. 31, 2017, which claims priority to U.S. Application No. 62/488,956, filed Apr. 24, 2017, all of which are incorporated by reference herein in their entireties.

BACKGROUND

Industry trends have led to a continuing increase in the number of transistors formed on a given substrate. Over the last four decades the semiconductor fabrication industry has been driven by a continual demand for greater performance (e.g., increased processing speed, memory capacity, etc.), a shrinking form factor, extended battery life, and lower cost. In response to this demand, the industry has continually reduced a size of semiconductor device components, such that modern day integrated chips may comprise millions or billions of semiconductor devices arranged on a single semiconductor die. Accordingly, the metal pitch of a semiconductor device has decreased to accommodate smaller transistors. A conventional semiconductor device includes a substrate, a circuit above the substrate, and metal lines that interconnect components of the circuit and that comply with electromigration (EM) rules.

EM is a phenomenon in which ions/atoms of a metal line of a semiconductor device migrate from a first region to a second region of the metal line and involves formation of voids at the first region of the metal line, which may cause an open circuit in the semiconductor device, and accumulation of the ions/atoms at the second region of the metal line, which may cause a short circuit in the semiconductor device. EM rules are established limiting a current flowing through a metal line to limit EM to an acceptable level.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
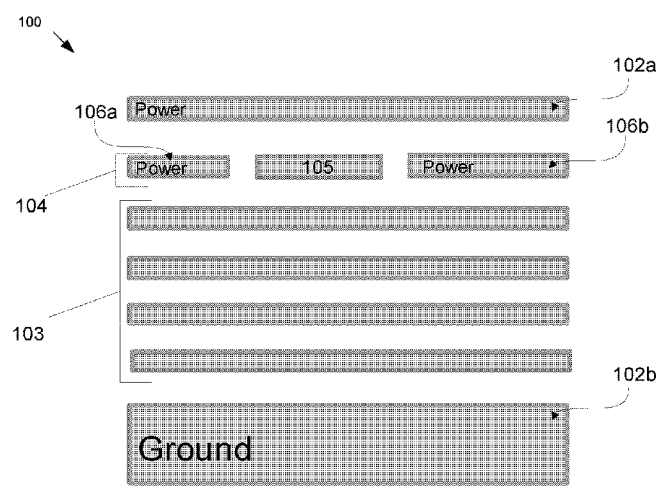
FIG. 1 illustrates an embodiment of a semiconductor cell interconnection metal pattern structure in accordance with the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor device cell may include transistors with metal pattern structures above the transistors. The metal pattern structures include metal routing resource lines, e.g. for interconnecting polysilicon structures, as well as power metal planes or lines for providing power to the cell components. A cell may have multiple pattern structures. For example, a first metal pattern structure may be formed over cell transistors, and a second metal pattern structure may be formed over the first metal pattern structure. A transistor polysilicon structure extends transverse to the resource lines of a first metal pattern structure and a second metal pattern structure. Those resource lines may be parallel to each other, or perpendicular to each other in distinct parallel planes.

As transistor density increases, interconnection metal patterning is scaled to provide sufficient power and signal routes, or resource routes, to the increased number of transistors in a given space. As the metal pitch decreases to accommodate smaller transistors, the overlaying issues between successive exposures and the cost of lithographic methods capable of patterning the metal pattern structures have become key obstacles in mass production. Such interconnection scaling must consider the effect of a decreasing cell height. As the cell height decreases, the pitch of the first metal patterning will fail to provide enough internal cell routing resources. Thus, in complicated standard cells, the minimum area cannot be achieved, which affects the die area.

As technology scales, the design area is an increasingly important factor in evaluating cost. One factor that can be reduced when scaling is to reduce a cell height, causing a corresponding decrease in cell area. But, a competing design technique is to increase the cell height or cell pitch when the first metal patterning fails to provide enough signal connection.

The present disclosure provides exemplary device(s)/method(s) for providing sufficient power and routing resources while accommodating a shorter cell height. It is typical for a first metal pattern to use symmetric power/ground structures, that is the power and ground structures have a same width. But, disclosed embodiments include a metal patterning structure that provides additional cell routing resources in the first metal pattern structure by relying on asymmetric power/ground structures. Similarly, second metal pattern structures having asymmetric power/ground structures may be formed and employed. In each case, the power/ground structures may be a first metal. In embodiments an asymmetric power/ground structure has a power or ground structure that has the same width as internal cell routing resource lines, and thus a portion of the power or ground structure is utilized as an internal cell routing resource. In order to mitigate IR/EM effects, a second metal is employed to interconnect power/ground structures within a cell. The second metal may be employed to interconnect power/ground structures within a first metal pattern or a second metal pattern structure, but also second metal may be employed to interconnect power/ground structures of the first metal pattern structure and the second metal pattern structure. Additionally, in embodiments, a power/ground structure relying on the third metal are employed to mitigate IR/EM effects by coupling narrower power metals in adjacent metal pattern structures.

As will be described hereafter, the present disclosure is based on a technique for decreasing the width of power metal planes in order to provide additional local routing recourses. By decreasing the width of one or more power/ground structures, additional resource metal lines, or routes, are provided within the same cell height. Additional resource metals may include both routing resources and power lines. The present disclosure is further based on a technique for decreasing the width of power/ground structures in order to provide additional power/ground structures. By decreasing the width of a power/ground structure, additional power/ground structures are accommodated within the same cell height. Additional power/ground structures having a same width as resource metals may include additional resource metal lines or routes.

A semiconductor cell interconnection metal pattern structure may be a first metal pattern structure or second metal pattern structure as discussed above. Metal pattern structures include two power/ground structures between which is a plurality of layers of metal resource lines or tracts. Metal resources include internal cell resource lines, or routes, for interconnecting transistor elements within the cell. In a conventional semiconductor cell interconnection metal pattern structure the power/ground structures are symmetric, meaning that the metal lines or planes or tracts of the power structure have the same width as the metal lines or planes or tracts of the ground structure.

FIG. 1 illustrates an embodiment of a semiconductor cell interconnection metal pattern structure 100 in accordance with the present disclosure. Metal pattern structure 100 may be a first metal pattern structure or a second metal pattern structure as discussed above. Metal pattern structure 100 includes asymmetric power/ground structures 102a and 102b. While 102a is labeled power and 102b is labeled ground, depending on the design of the semiconductor cell, the purpose of 102a and 102b may be interchanged. Between the asymmetric power/ground structures 102a, 102b are a plurality of layers of metal resources 103 that may include internal cell resource lines or routes for interconnecting transistor elements within the cell. Also between asymmetric power/ground structures 102a, 102b is an additional power/ground structure layer 104 that includes an additional metal resource 105 for local in-cell routing and additional power/ground structures 106a and 106b. Structures 102a and 104 have a same width, or substantially the same width, as the metal resources 103. In this way, interconnection metal pattern structure 100 may have the same height as a conventional interconnection metal pattern while including additional resource metal, e.g. 105.

Figure 2:
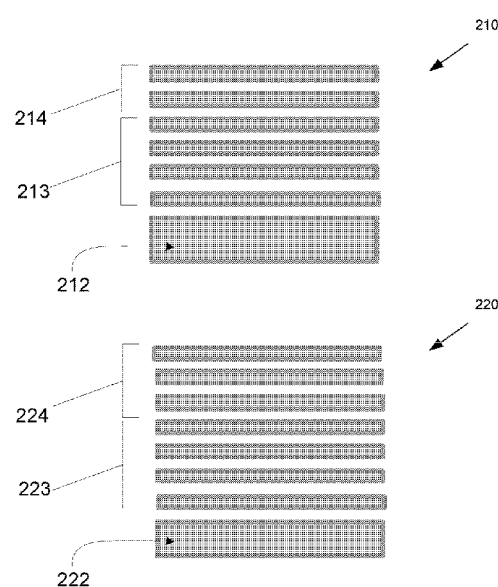
FIG. 2 illustrates two exemplary semiconductor interconnection metal pattern structures in accordance with the present disclosure.

FIG. 2 illustrates two semiconductor interconnection metal pattern structures 210 and 220. Metal pattern structure 210 is an exemplary odd metal tract structure in accordance with the present disclosure and includes asymmetric power/ground structures 212 having one power/ground tract and power/ground structure 214 having two power/ground tracts. Power/ground structure 214 comprises two metal layers each having a width substantially the same as the width of an individual resource metal layer within resource metal layers 213, and which is less than the width of power/ground structure 212. Power/ground structure 214 may also include additional metal resource tracts within either of power ground tract. Metal pattern structure 220 is an exemplary even metal tract structure in accordance with the present disclosure and includes asymmetric power/ground structures 222 having one power/ground tract and power/ground structure 224 having three power ground tracts. Power/ground structure 224 comprises three metal layers each having a width substantially the same as the width of an individual resource metal layer within resource metal layers 223, and which is less than the width of power/ground structure 222. Power/ground structure 214 may also include additional metal resource tract.

Both of the structures 210, 220 provide distinct benefits over conventional structures. For example, a conventional structure provides strong power and ground coupling, but lacks internal routing resources within the cell. Whereas, the odd metal tract configuration structure 210 includes two additional layers for including additional metal resource tracts for routing, while the even metal tract configuration structure 220 includes three additional layers for internal metal resource tracts. These benefits are gained in both 210 and 220 these at the expense of possible IR/EM issues, and the additional power/ground tracts occupy spaces that could be devoted to additional routing resources.

Figure 3:
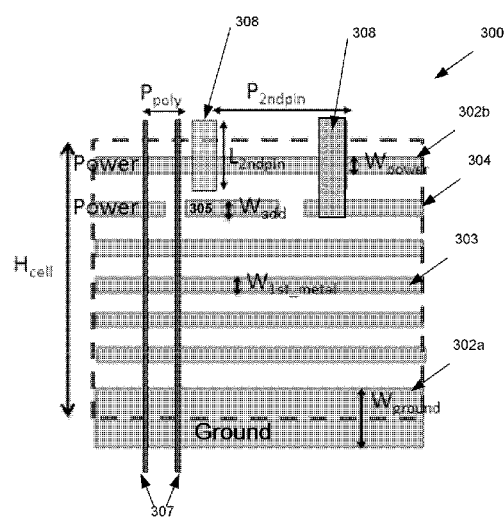
FIG. 3 illustrates an exemplary semiconductor cell interconnection metal pattern structure in accordance with the present disclosure.

FIG. 3 illustrates an exemplary semiconductor cell interconnection metal pattern structure 300 in accordance with the present disclosure. Structure 300 may be a $1^{st}$ metal pattern, e.g. M0, structure formed over transistors for providing signal routing between transistor elements. Structure 300 includes an asymmetric power structures 302a/302b in accordance with this disclosure, thereby allowing additional metal resource lines 305. Structure 300 includes multiple metal patterning layers interconnecting multiple transistor polysilicon gate structures 307 for applying routed signals within a semiconductor cell to transistor elements. As depicted, various parameters overlaying structure 300 for characterizing the features of structure 300. Structure 300 includes a ground structure 302a, a power structure 302b, additional power structure 304, a plurality of metal resource tracts 303, and an additional metal resource tract 305. In embodiments, power and ground are interchangeable such that 302a provides power and structure 302b provides ground. FIG. 3 also illustrates two polysilicon structures 307 and two follow pins 308. Follow pins 308 connect power/ground structures, e.g. 304, 302b, together as much as possible. Follow pins 308 may be of a first metal or a second metal, in embodiments a second metal structure is referred to as a M1 structure.

Features of metal pattern structures, such as an M0 patterning or metal pattern structure 300, may be characterized by a number of different parameters. Structure 300 has a height $H_{cell}$. The power/ground structures 302a, 302b, and 304 each have a width; ground structure 302a having a width $W_{ground}$, while power structures 302b, 304 have a width $W_{power}$. The metal resource lines 303 have a width $W_{1st\_metal}$ and the additional metal resource line or tract has a width $W_{add}$. The polysilicon structures 307 define a pitch, $P_{poly}$, and similarly the follow pins 308 define a pitch, $P_{2ndpin}$. Additionally, a follow pin defines a length $L_{2ndpin}$. A semiconductor structure in accordance with this disclosure, e.g. structure 300, has an asymmetric power/ground structure meaning that is $W_{ground} \neq W_{power}$.

Figure 4:
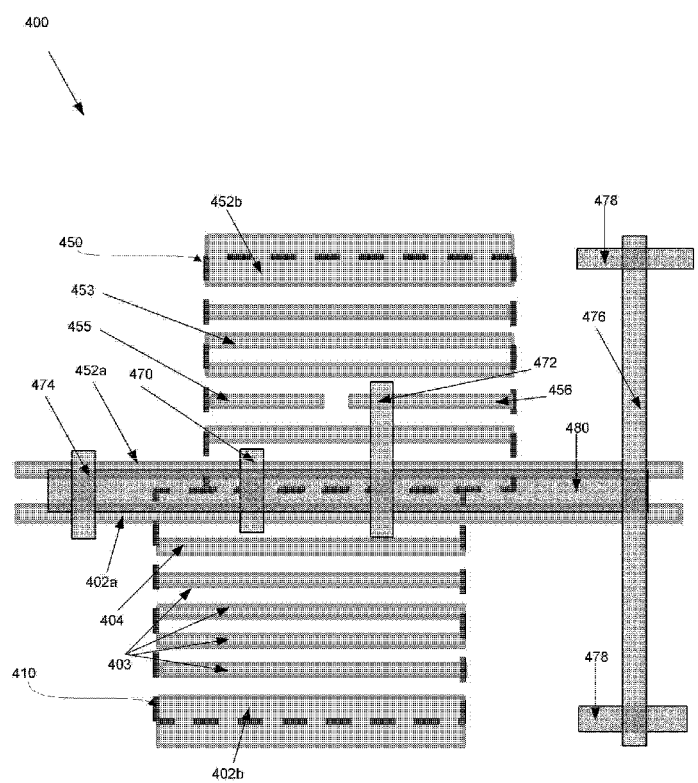
FIG. 4 illustrates an exemplary semiconductor cell interconnection metal pattern structure in accordance with the present disclosure.

FIG. 4 illustrates an exemplary semiconductor cell interconnection metal pattern structure 400. When a first metal pattern has sufficient resource lines, such that some metal resource lines may be devoted to power metal, an in cell follow pin can be used within the cell to mitigate EM and IR issues. But, when additional metal resource lines are needed within a cell, metal power resources outside a cell may be used to mitigate EM and IR issues, for example, by coupling two or more thin power metals together using a pillar or strap. Metal pattern structure 400 illustrates these various techniques.

Metal pattern structure 400 includes a first interconnection metal pattern structure 410 and second interconnection metal pattern 450. Metal pattern structures 410 and 450 may each be a first metal or an M0 metal pattern structure. The first interconnection metal pattern structure 410 includes a power metal 402a, a ground metal 402b, metal resource lines 403, and an additional metal resource line 404. The second interconnection metal pattern structure 450 includes a power metal 452a, a ground metal 452b, metal resource lines 453, an additional metal resource line 455, and an additional power metal 456 sharing the same layer as additional metal resource line 455. Semiconductor interconnection metal pattern structure 400 includes an in-cell follow pin 470 coupling, or interconnecting, power metal 402a with power metal 452a and with a third power metal 480 that may be formed in a layer that extends to lengths external to both structures 410 and 450, and may be formed in a layer a portion of which is shared by structures 410 and 450, and the third power metal 480 may be formed in a layer that is separate and distinct from the layers of structures 410 and 450. Semiconductor interconnection metal pattern structure 400 also includes a second in-cell follow pin 472 coupling, or interconnecting, the power metals 402a, 452a, 480 with the additional power resource metal 456.

When the metal resource tracts, e.g. 403, 453, are sufficient for desired in-cell routing (e.g., to interconnect polysilicon structures (not illustrated in FIG. 4)) the in-cell follow pins are utilized, for example as in structure 410. Also, power structures external to a semiconductor cell may be employed. For example, semiconductor interconnection metal pattern structure 400 also includes pillar structure 474, that is external to both structures 410 and 450, interconnecting power metals 402a, 452a, and 480. As illustrated here, pillar structure 474 is a single pin pillar structure. A strap structure 476 may also be employed to connect power metals 402a, 452a, 480 to other metal power structures 478 within a semiconductor device, but external to a particular cell. In embodiments, the metal interconnection pattern structures, including power/ground structures, e.g. 402a, 402b, 452a, 452b, 456, and resource tracts/lines, e.g. 403, 453, 455, may be of a first metal, e.g. M0; the follow pins, pillar structures, and strap structures may be of a second metal, e.g. M1; and the additional power structures 478, 480 may be of a third metal, e.g. M2. In alternative embodiments, strap structure 476 is employed to couple power/ground metals that are disposed distally from each other, e.g. power/ground metal 402b and 452b.

Figure 5:
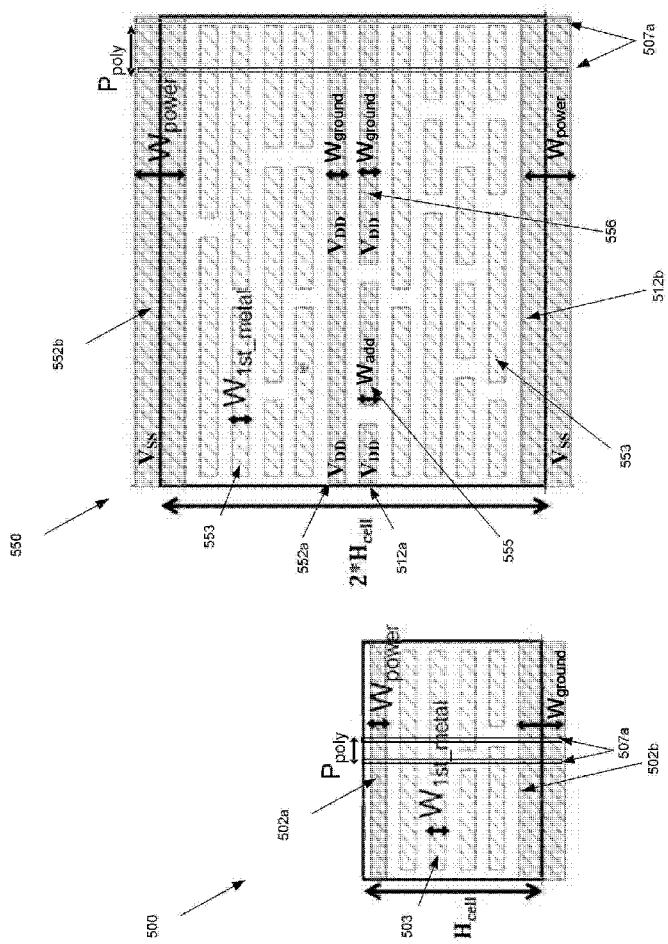
FIG. 5 illustrates exemplary even-tract first metal structures.

In embodiments, employing asymmetric power/ground metals having different widths enables additional space within the cell for additional metal resources, such that a power ground structure may have an even number or an odd number of layers. Additional metal resources may be formed within an added metal resource layer, or alternatively metal resource lines may be formed within a thinner power metal layer. FIG. 5 illustrates exemplary even-tract first metal structures 500 and 550. Each even-tract first metal structure includes an even number of power/ground structure layers. Structure 500 has a height of $1 \times H_{cell}$ and may be an interconnection structure for transistors comprising an AND/OR/NOT device and having polysilicon structures 507a defining a pitch. Structure 500 includes first metal power/ground structures 502a, 502b and resource tracts 503. As illustrated first metal power/ground structure 502a is voltage source source (VDD) and first metal power/ground structure 502b is voltage drain drain (VSS), but in other exemplary embodiments of structure 500 VSS and VDD may be exchanged such that structure 502a would correspond to VSS and structure 502b would correspond to VDD. Even-tract metal structure 550 has a height of $2 \times H_{cell}$ and may be an interconnection structure for transistors comprising a flip-flop and having polysilicon structures 507b defining a pitch. Structure 550 includes first metal power/ground structures 512a, 512b, 552a, 552b and 556. As illustrated structures 512a, 552a, and 556 provide VDD while 512b, 552b provide VSS, but in other exemplary embodiments of structure 550 VSS and VDD may be exchanged such that structures 512a, 552a, and 556 provide VSS and 512b, 552b provide VDD. In both exemplary even-tract embodiments structures 500, 550 have characteristic parameters assuming $W_{ground} < W_{power}$. In each structure 500, 550 there are an even number of power/ground structures 502a, 502b in structure 500 and 512a, 512b, 552a, 552b in structure 550. In structure 550, power metal 512a layer includes additional resource metal line 555. In exemplary structures 500, 550, Hcell is between approximately $3*W_{power}$ and approximately $6*W_{power}$. And $W_{ground} \neq W_{power}$, but instead $W_{power}$ is between approximately $1.5*W_{ground}$ and $2.5*W_{ground}$, and the width of the resource tracts, $W_{1st\_metal}$, is between approximately $1*W_{ground}$ and approximately $2.5*W_{ground}$.

Similarly, the width of the additional resource tracts 555, $W_{add}$, is approximately $1*W_{ground}$ and approximately $2.5*W_{ground}$. As a result of the asymmetric power structures, each of structures 500 and 550 may suffer from EM effects and an IR drop without additional enhancement.

Figure 6:
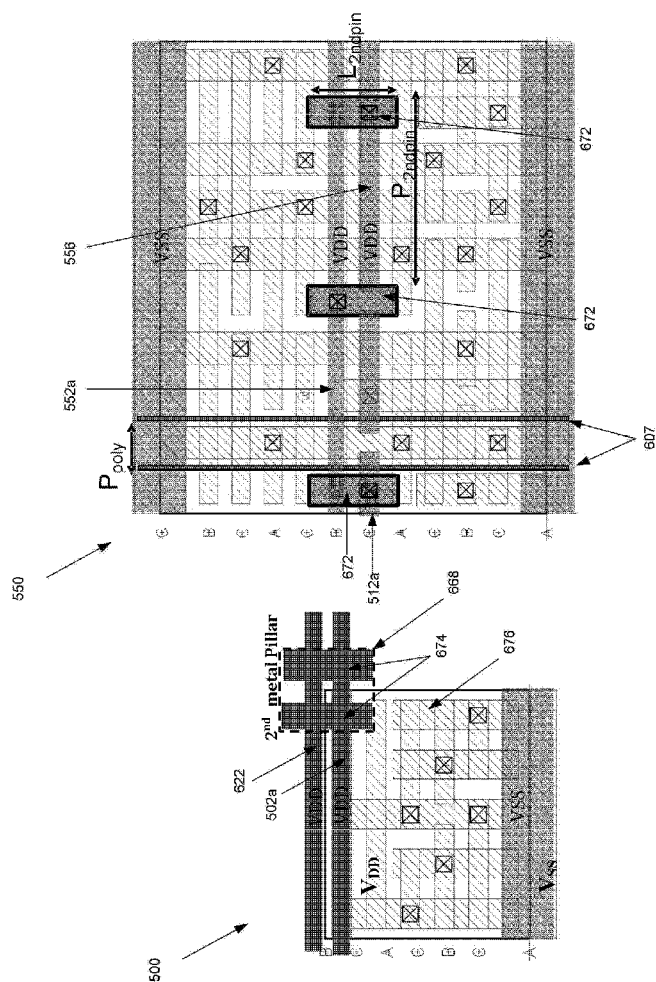
FIG. 6 illustrates enhanced power coupling features for mitigating EM effects and preventing an IR drop in exemplary in even-tract structures in accordance with the present disclosure.

In order to address the EM/IR effects that may arise in structures 500 and 550 as a result of their asymmetric power structures, enhanced power coupling features are employed. FIG. 6 illustrates enhanced power coupling features for mitigating EM effects and preventing an IR drop in exemplary in even-tract structures 500 and 550. Structure 500 employs a second metal pillar pin structure 568 for coupling power/ground metal structure 502a to a power/ground metal structure 622 that external to the structure 500. In the exemplary embodiment illustrated, pillar pin structure 568 comprises a dual pin 674 second metal structure. Also, structure 550 includes a short second metal follow pin 676 under structure 674 for coupling resource lines. Structure 550 employs a series of single pin pillar structures 672 in order to couple power/ground structures 512a, 552a, and 556 of two metal structures. Second metal single follow pin structures 672 couple the metal power/ground lines that are disposed proximate to each other (as opposed to 512b, 552b which are disposed distal to each other). Second metal follow pins 672 define a pitch $P_{2ndpin}$ and a length $L_{2ndpin}$. Also depicted is a pair of polysilicon structures 607 defining a pitch $P_{poly}$. $P_{2ndpin}$ is between approximately $1*P_{poly}$ and approximately $24*P_{poly}$, and $L_{2ndpin}$ is between approximately $0.2*H_{cell}$ and approximately $0.5*H_{cell}$.

Figure 7:
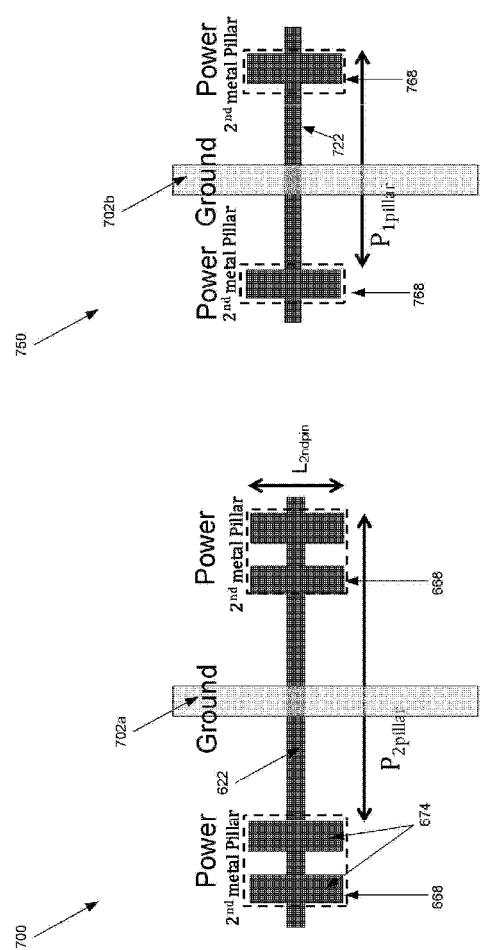
FIG. 7 illustrates exemplary embodiments of power structures in even-tract first metal interconnection pattern structures in accordance with the present disclosure.

To mitigate the IR/EM effects to within acceptable levels second metal pillar structures can be employed in an even-tract embodiment for coupling to power/ground structures external to a cell. FIG. 7 illustrates exemplary embodiments of pillar power structures employed in an even-tract first metal interconnection pattern structures, which may be exemplary structure 500 or 550. Pillar power structure 700 includes pillar structures 668, each including two pillar pins 674, coupled to a power network metal 622. Dual pin pillar structures 668 define a pitch $P_{2pillar}$ that is between approximately $48*P_{poly}$ and approximately $60*P_{poly}$. Pillar power structure 750 includes pillar power structures 768, each including single pillar pins, coupled to power network 722. Single pin pillar structures 768 define a pitch $P_{1pillar}$ that is between approximately $24*P_{poly}$ and approximately $30*P_{poly}$. Each pillar power structure 700, 750 additionally include a strap structure 702a, 702b that couples to a power/ground structure corresponding to ground network as illustrated. In both cases, the length of the $2^{nd}$ metal pillar pins, in a single or dual pillar pin configuration, is between $0.2*H_{cell}$ and $0.5*H_{cell}$. In each of structures 700, 750 the designation of power and ground for the pillar structure power networks 622, 722 and the strap structures 702a, 702b may be freely interchanged as needed depending on design considerations, without modifying the pitch defined by the one pin or two pin pillar structures above.

Figure 8:
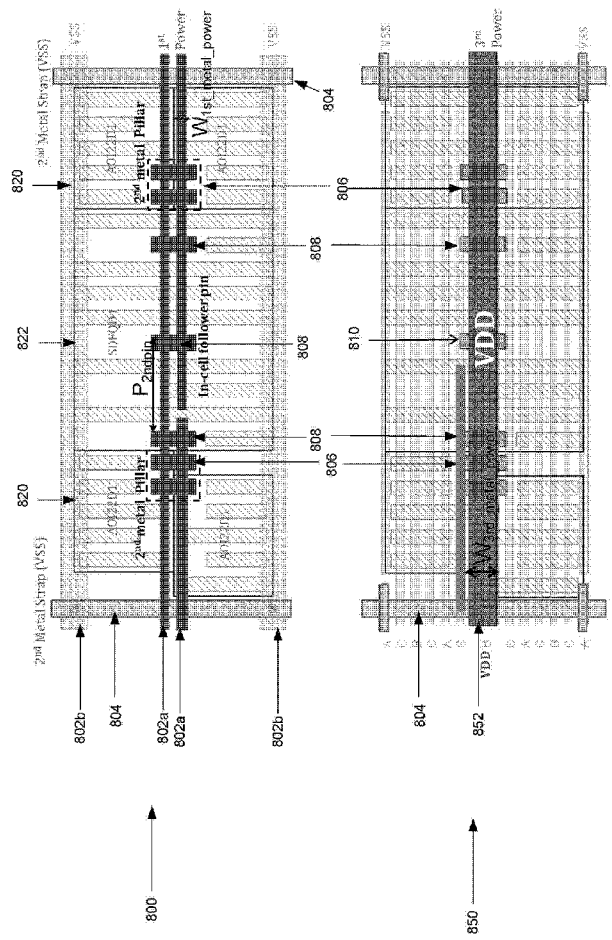
FIG. 8 illustrates exemplary embodiments of an even-tract structure formed of first metal power structures, second metal power structures, and third metal power structure in accordance with the present disclosure.

An even-tract power structure is suitable for interconnecting transistors over which the structures depicted in FIG. 8 are formed. FIG. 8 illustrates another exemplary embodiment of an even-tract structure formed of first metal power structures 802a, 802b; second metal power structures 804; and third metal power structure 852. The depicted exemplary even power metal tract structure is shown in two portions 800 and 850 for ease of depiction. Portion 800 illustrates the first metal power structures 802a, 802b and second metal 804. The exemplary first power metal tract structure is depicted interconnecting transistors in a number of cells corresponding to AND/OR/NOT devices 820 and a flip flop device 822. The first metal power structure 802a comprises two first power lines 802a coupled together via pillar structures 806 as well as via second metal follow pins 808. The first metal power structure 802a is further coupled to a second metal resource line 810 within cell 822 which is thereby also used for VDD. Each tract of first metal power structure 802a defines a width $W_{1st\_metal\_power}$. The first metal power structure further includes two first metal power structures 802b, labeled VSS. The first metal power structures 802b are coupled together via second metal power straps 804. A third metal power structure 852 is further coupled to first metal power structures by pillar structures 806 and similarly internal metal resource tract 810 is coupled to third metal power 852 by in-cell follow pins 808. The third metal power strap 852 defines a width $W_{3rd\_metal\_power}$ that is between approximately $1.5*W_{first\_metal\_power}$ and approximately $3*W_{first\_metal\_power}$.

Figure 9:
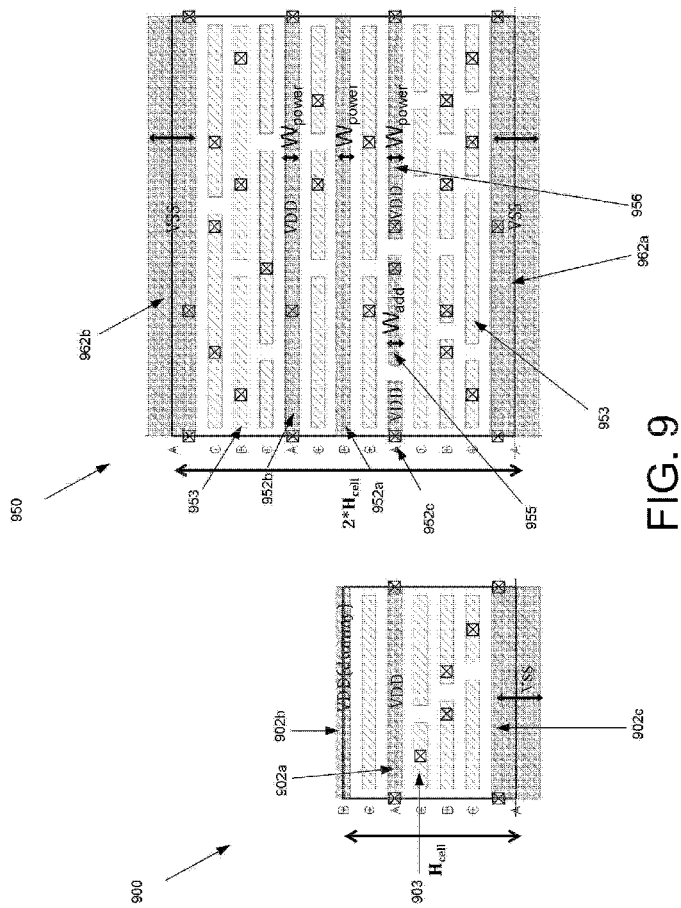
FIG. 9 illustrates exemplary odd-tract first metal structures in accordance with the present disclosure.

In embodiments, employing asymmetric power/ground metals having different widths enables additional space within the cell for additional metal resource layers, such that a power ground structure may have an odd number of layers. Additional metal resources may be formed within an added metal resource layer, or alternatively metal resource lines may be formed within a thin power metal layer. FIG. 9 illustrates exemplary odd-tract first metal structures 900 and 950. Each odd-tract first metal structure 900, 950 includes an odd number of power/ground structure layers, e.g. 902a, 902b, 902c or 952a, 952b, 952c, 962a, 962b. Odd-tract structure 900 is a single height embodiment and has a height of $1\times H_{cell}$ and may be an interconnection structure for transistors comprising an AND/OR/NOT device and having polysilicon structures defining a pitch. Structure 900 includes first metal power/ground structures 902a, 902b, 902c and resource tracts 903. As illustrated first metal power/ground structures 902a and 902b is VDD and first metal power/ground structure 902c is VSS, but in other exemplary embodiments of structure 900 VSS and VDD may be exchanged such that structures 902a, 902b would correspond to VSS and structure 902c would be VDD.

Odd-tract first metal structure 950 is a double height structure having a height of $2\times H_{cell}$ and may be an interconnection structure for transistors comprising a flip flop and having polysilicon structures defining a pitch. Structure 950 includes first metal power/ground structures 952a, 952b, 952c, 962a, 962b and 956, where the tract layer including 952c and 956 also includes an additional routing resource 955. As illustrated structures 952a, 952b, and 956 provide VDD while structures 962a, 962b provide $V_{SS}$, but in other exemplary embodiments of structure 950 $V_{SS}$ and $V_{DD}$ may be exchanged such that structures 952a, 952b, and 956 provide $V_{SS}$ and 962a, 962b provide $V_{DD}$. In both exemplary odd first metal tract embodiments structures 900, 950 have characteristic parameters, assuming $W_{ground} < W_{power}$. In each structure 900, 950 there are an odd number of first metal power tract layers corresponding to 952a, 952b, 952c, 962a, and 962b, where structure 956 is associated with the same layer as 952c. In the embodiments 900, 950 depicted in FIG. 9, $H_{cell}$ is between approximately $3*W_{power}$ and approximately $6*W_{power}$. And $W_{ground} \ne W_{power}$, but instead $W_{power}$ is between approximately $1.5*W_{ground}$ and $2.5 W_{ground}$. The width of the resource tracts 903, 953, $W_{1st\_metal}$, is between approximately $1*W_{ground}$ and approximately $2.5*W_{ground}$. Similarly, the width of the additional resource tracts 955, $W_{add}$, is approximately $1*W_{ground}$ and approximately $2.5*W_{ground}$. As a result of the asymmetric power structures, odd-tract structures have additional routing resources, but as each of structures 900 and 950 may suffer from EM effects and an IR drop without additional enhancement.

Figure 10:
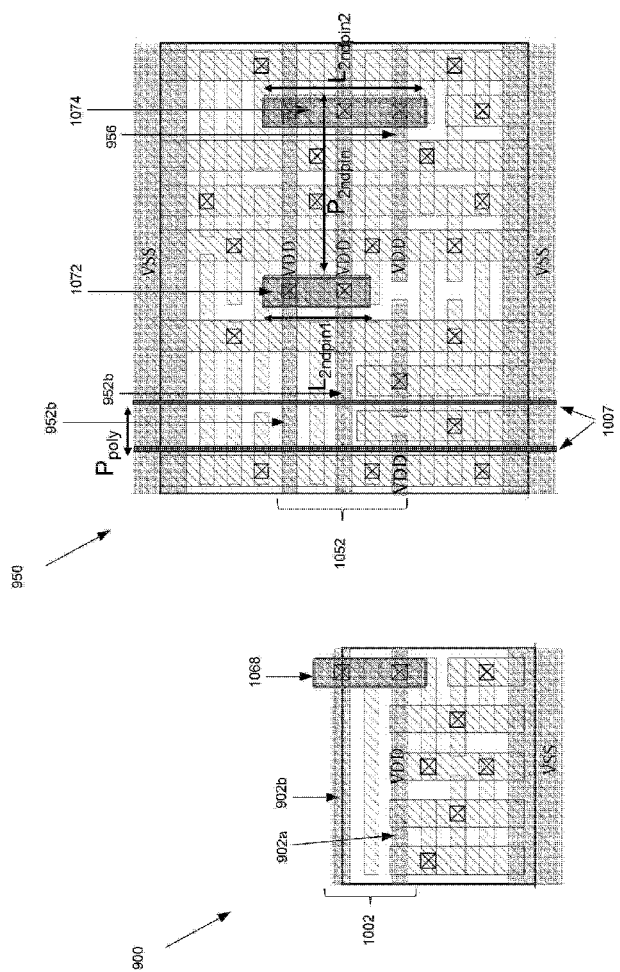
FIG. 10 illustrates enhanced power coupling features for mitigating EM effects and preventing an IR drop in exemplary odd-tract structures.

In order to address the EM/IR effects that may arise in structures 900 and 950 as a result of their asymmetric power structures, enhanced power coupling features are employed. FIG. 10 illustrates enhanced power coupling features for mitigating EM effects and preventing an IR drop in exemplary odd-tract structures 900 and 950. Structure 900 employs a second metal in-cell follow pin structure 1068 for coupling power/ground metal structures 902a and 902b resulting in a combined power/ground structure 1002. In the exemplary embodiment power ground structure 1002 provides VDD to structure 1000. Structure 950 employs in-cell second metal follow pins 1072, 1074 in order to couple power/ground structures 952a, 952b, and 956 to form a combined power/ground structure 1052. In-cell second metal follow pins 1072 and 1074 define a pitch $P_{2ndpin}$ and second metal follow pin 1072 defines length $L_{2ndpin1}$ while second metal follow pin 1074 defines a second length $L_{2ndpin2}$. Also depicted is a pair of polysilicon structures 1007 defining a pitch $P_{poly}$. In embodiments, $P_{2ndpin}$ of structure 950 is between approximately $1*P_{poly}$ and approximately $24*P_{poly}$, and $L_{2ndpin1}$ and $L_{2ndpin2}$ are each between approximately $0.2*H_{cell}$ and approximately $1*H_{cell}$. The $L_{2ndpin1}$ and $L_{2ndpin2}$ connect the power/ground 1052 together as much as possible. The second metal follow pins 1068, 1072, 1074 should connect each of first metal VDD (or each first metal of VSS in an alternative embodiment interchanging VSS and VDD as discussed above).

Figure 11:
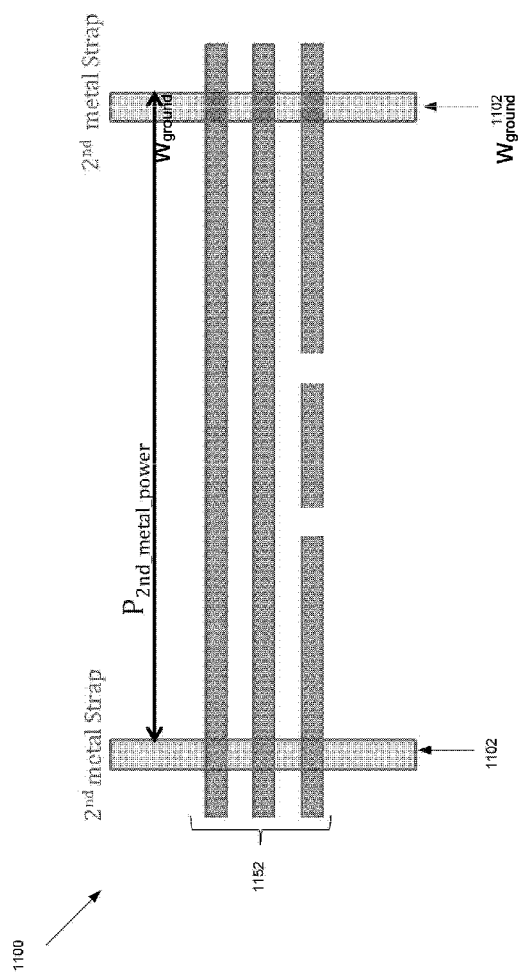
FIG. 11 illustrates power structure enhancements incorporating first metal power structures in accordance with the present disclosure.

Additional techniques may be employed in an odd-tract configuration for mitigating EM/IR effects in the resulting structure. For example second metal structures outside a cell can be employed to couple first metal power/ground lines together. FIG. 11 illustrates power structure enhancements 1100 incorporating first metal power structures 1152. For example, first metal power structure 1152 may be extended portions of structure 1052. In order to couple all the power metal tracts, second metal power straps 1102 may be employed outside of the cell boundary. Second metal power strap structures 1102 are formed to define a pitch $P_{2nd\_metal\_power}$ that is between approximately $4*P_{poly}$ and approximately $30*P_{poly}$.

Figure 12:
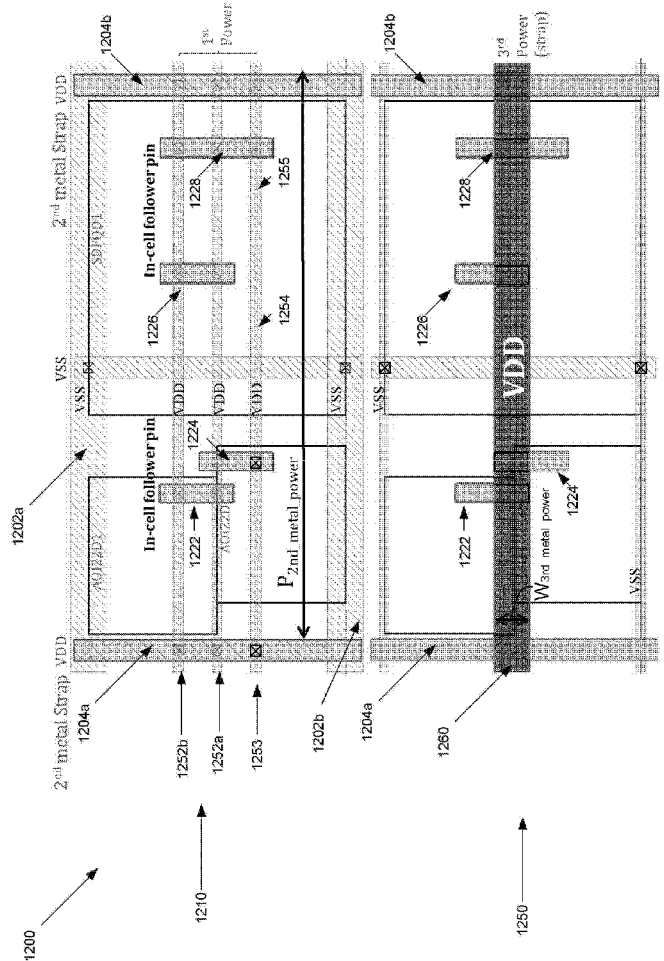
FIG. 12 illustrates exemplary embodiments of an odd first power metal tract structure in accordance with the present disclosure.

An odd-tract power structure is suitable for interconnecting transistors over which the structures depicted in FIG. 12 are formed. FIG. 12 illustrates an exemplary embodiment of an odd first power metal tract structure and is formed of layers 1252a, 1252b and a layer including distinct lines 1253, 1254 and 1255. Thus, the odd-tract structure includes an odd number of first metal layers depicted as providing VDD, first metal structures 1202a and 1202b depicted as providing VSS; second metal power structures 1204a and 1204b forming VDD power straps for coupling each of power metal lines of 1252a, 1252b, and 1253, 1255, and a third metal power metal 1260 also providing VDD. Each of the depicted VDD metals, including layers 1252a, 1252b and the layer including 1253, 1255 and metal 1260, are coupled together via second metal straps 1240a and 1240b. The depicted exemplary odd-tract power metal structure is shown in two portions 1210 and 1250 for ease of depiction. Portion 1210 illustrates the first metal power structures 1202a, 1202b, 1252a, 1252b, 1253, 1255, and second metal 1204a, 1204b. The exemplary illustrated odd-tract first power metal structure 1200 is depicted interconnecting transistors in a number of cells corresponding to AND/OR/ NOT devices and a flip flop device. The first metal power structure including 1252a, 1252b, 1253, 1255 comprises three first metal power layers coupled together via in-cell follower pins 1222, 1224, 1226, 1228 as well as via second metal power straps 1204a, 1204b. Distinct metal line 1254 remains uncoupled to the first metal power structure including 1252a, 1252b, 1253, 1255 so that it may be utilized as an additional metal resource route, or resource tract. Each tract of first metal power structure including 1252a, 1252b, 1253, 1255 defines a width $W_{1st\_metal\_power}$. The first metal power structure further includes two additional first metal power structures, 1202a and 1202b, depicted as VSS. A third metal power structure 1260 is further coupled to first metal power structures by the in-cell follower pins 1222, 1224, 1226, 1228. The third metal power strap 1260 defines a width $W_{3rd\_metal\_power}$ that is between approximately $1.5*W_{first\_metal\_power}$ and approximately $3*W_{first\_metal\_power}$.

Figure 13:
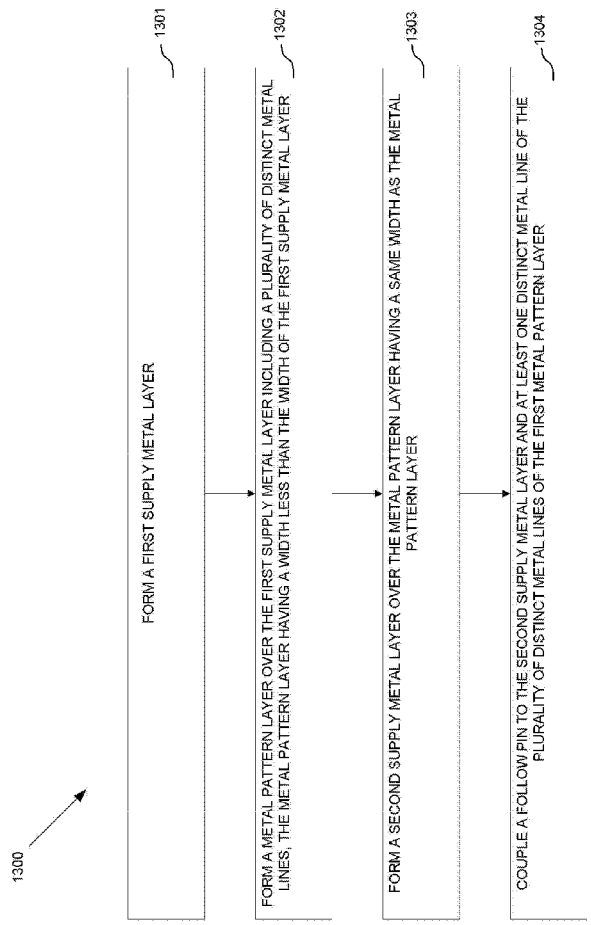
FIG. 13 depicts an example flow chart of exemplary operations for various processes when forming a semiconductor device or structure.

FIG. 13 depicts an example flow chart of operation 1300 for forming a semiconductor device or structure. The process of FIG. 13 is relevant to many structures. The process is described here with reference to FIGS. 5, 6, 9, 10, and 12 for ease in understanding. As shown in FIG. 13, at 1301 a first supply metal layer, such as supply metal layer 512b, 902c, 962a, or 1202b, is formed. A first supply metal layer may be formed of a first metal. The first supply metal layer may be a power supply or a ground supply layer. At 1302, a metal pattern layer is formed over the first supply metal layer and includes a plurality of distinct metal lines. A metal pattern layer may be, for example, a layer including lines 512a, 555, 556, or 952c, 955, 956, or 1253, 1254, 1255. The metal pattern layer is formed to a width less than the width of the first supply metal layer. The lines of the metal pattern layer may also be formed of a first metal. A second supply metal layer is formed at 1303 such that the metal pattern layer lies between the first supply metal layer and the second supply metal layer. The second supply metal layer, such as layers 552a, 952a, and 1252a, also has a width that is less than the first supply metal layer, thus resulting in asymmetric power structures. In embodiments, the second supply metal layer has substantially the same width as the metal pattern layer. In other embodiments, the width of the second supply metal layer is less than or between the width of the metal pattern layer and the first supply metal layer. At 1304, a follow pin is formed within the semiconductor structure or device such that it couples the second supply metal layer to one of the distinct lines of the first metal pattern layer such as lines 512a, 556, 952c, 956, or 1253, 1255, such that the coupled lines provide the same supply as the second supply layer. In embodiments the follow pin is formed of a second metal different from the first metal. In embodiments uncoupled metal pattern layer lines, such as 555, 955, 1254 may be used as additional first metal resource lines.

In one embodiment a semiconductor device cell comprises a first pattern metal layer disposed between a first supply metal tract and a second supply metal tract, the first pattern metal layer comprising an internal route and a power route. A follow pin couples the first supply metal to the power route. In variations, the second supply metal tract may be wider than the first supply metal tract. The first supply metal tract may have a thickness substantially same as the first pattern metal layer. In some aspects a second pattern metal layer is disposed between the first supply metal tract and the second supply metal tract, where the second pattern metal layer also includes a second internal route, and a second power route, such that the follow pin couples the first supply metal tract to the second power route. In some aspects, the first supply metal tract is a power supply or a voltage source source ("VSS"), and the second supply metal tract is a ground supply or a voltage drain drain ("VDD").

In some aspects, the first supply metal tract and the second supply metal tract comprise a first metal and a follow pin comprises a second metal.

In another embodiment a semiconductor structure comprises a first cell having a first supply metal line, a second supply metal line having a width greater than a width of the first supply metal line, and a first pattern metal layer disposed between the first supply metal line and the second supply metal line. The first pattern metal layer has a width substantially the same as a width of the first supply metal line. The first pattern metal layer includes a first internal route, a first power route. The semiconductor structure also comprises a second cell formed above the first cell having a third supply metal line proximal to the first supply metal line and having a width substantially the same as the first supply metal line, and a fourth supply metal line distal to the second supply metal line and having a width greater than a width of the third supply metal line. A second pattern metal layer is disposed between the third supply metal line and the fourth supply metal line and has a width substantially the same as a width of the third supply metal line. The second pattern metal layer comprises a second internal route and a second power route.

In some aspects the semiconductor structure further includes a first in-cell follow pin coupling the first supply metal line to the third supply metal line. In some aspects, the semiconductor structure further comprising a fifth supply metal line between the first supply metal line and the third supply metal line and having a width between 1.5 and 3 times the width of the third supply metal line, and the first in-cell follow pin is further coupled to the fifth supply metal line. In some aspects, the first in-cell follow pin is coupled to the first power route or the second power route. In some aspects, a first pillar metal structure external to the first cell and the second cell couples the first supply metal line to the third supply metal line, and a second pillar metal structure external to the first cell and the second cell couples the first supply metal line to the third supply metal line. In some aspects, the semiconductor structure includes at least two polysilicon structures within the first cell that define a first pitch wherein the first pillar metal structure and the second pillar metal structure are each single pillar pins and the first pillar metal structure and the second pillar metal structure define a second pitch that is greater than the first pitch by a factor of between 24 and 30. Alternatively, the first pillar metal structure and the second pillar metal structure each comprise two pillar pins and the pitch of the first pillar metal structure and the second pillar metal structure is greater than the first pitch by a factor of between 48 and 60. In some aspects, the semiconductor structure also includes a fifth metal supply line between the first metal supply line and the third metal supply line, a first pillar metal structure external to the first cell and coupled to the first supply metal line, the third supply metal line, and the fifth supply metal line, and a second pillar metal structure external to the first cell and coupled to the first supply metal line, the third supply metal line, and the fifth supply metal line. In some aspects, the first supply metal line and the third supply metal line are power supply lines or VSS lines, and the second supply metal lines and the fourth supply metal lines are ground lines or VDD lines. In some aspects, the semiconductor structure includes a first strap structure coupled to the second supply metal line and the fourth supply metal line; and a second strap structure coupled to the second supply metal line and the fourth supply metal line wherein the first strap structure and the second strap structure define a second pitch larger than the first pitch by a factor of between 4 and 30.

In embodiments, a semiconductor structure comprises a first supply metal layer, a second supply metal layer having a width substantially the same as a width of the first metal supply layer, a third supply metal layer between the first supply metal layer and the second supply metal layer having a width greater than the first metal supply layer by a factor of 1.5 to 3, a first pattern metal layer disposed between the first supply metal layer and the third supply metal layer and having a width substantially the same as a width of the first supply metal layer and including a first internal route, and a first power route. The semiconductor structure also includes a second pattern metal layer disposed between the third supply metal layer and the second supply metal layer and having a width substantially the same as a width of the first metal supply layer, the second pattern metal layer comprising a second internal route, and a second power route, and a first follow pin coupled to the first supply metal layer and the first power route, and a second follow pin coupled to the second supply metal layer and the second power route. In some aspects, the semiconductor structure also may include a strap metal structure coupled to the first supply metal layer and the second supply metal layer, or a pillar metal structure coupled to the third supply layer and a third power route between the first supply metal layer and the second supply metal layer, the third supply power route having a width substantially equal to the first supply metal layer.

In an interrelated embodiment a method for forming a semiconductor structure, is disclosed. The method comprises forming a first supply metal layer, forming a first metal pattern layer over the first supply layer, the first metal pattern layer having a width less than the width of the first supply metal layer and having a plurality of distinct metal lines, forming a second supply metal layer over the first metal pattern layer, the second supply metal layer having substantially the same width as the first metal pattern layer, and coupling a follow pin to both the second supply metal layer and at least one distinct metal line of the plurality of distinct metal lines of the first metal pattern layer. In some aspects, the method includes forming each of first supply metal layer, the first metal pattern layer, and the second supply metal layer of a first metal, and forming the follow pin of a second metal different from the first metal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a first pattern metal layer disposed between a first supply metal tract and a second supply metal tract, wherein the first supply metal tract, and the second supply metal tract are arranged in parallel, the first pattern metal layer comprising:
    a first power route; and
    a follow pin coupling the first supply metal tract to the first power route and a second power route of a second pattern metal layer disposed between the first supply metal tract and the second supply metal tract.

2. The semiconductor device of claim 1, wherein the second supply metal tract is wider than the first supply metal tract.

3. The semiconductor device of claim 2, wherein the first supply metal tract has a thickness substantially same as the first pattern metal layer.

4. The semiconductor device of claim 1, further comprising:
the second pattern metal layer disposed between the first supply metal tract and the second supply metal tract, the second pattern metal layer comprising:
a first internal route;
a second internal route; and
the second power route.

5. The semiconductor device of claim 1, wherein:
the first supply metal tract is a power supply or a voltage drain drain ("VDD") and the second supply metal tract is a ground supply or a voltage source source ("VSS").

6. The semiconductor device of claim 1, wherein the first supply metal tract and the second supply metal tract comprise a first metal and the follow pin comprises a second metal.

7. A semiconductor structure, comprising:
a first cell, including:
a first supply metal line;
a second supply metal line; and
a first pattern metal layer disposed between the first supply metal line and the second supply metal line, the first pattern metal layer comprising:
a first power route; and
a second cell formed below the first cell, including:
a third supply metal line proximal to the first supply metal line;
a fourth supply metal line distal to the second supply metal; and
a second pattern metal layer disposed between the third supply metal line and the fourth supply metal line.

8. The semiconductor structure of claim 7, further comprising:
a first in-cell follow pin coupling the first supply metal line to the third supply metal line.

9. The semiconductor structure of claim 8, further comprising a fifth supply metal line between the first supply metal line and the third supply metal line and having a width between 1.5 and 3 times the width of the third supply metal line, wherein the first in-cell follow pin is further coupled to the fifth supply metal line.

10. The semiconductor structure of claim 8, wherein the first in-cell follow pin is coupled to the first power route or a second power route in the second pattern metal layer.

11. The semiconductor structure of claim 7, further comprising:
a first pillar metal structure external to the first cell and the second cell and coupling the first supply metal line to the third supply metal line; and
a second pillar metal structure external to the first cell and the second cell and coupling the second supply metal line to the third supply metal line.

12. The semiconductor structure of claim 11, further comprising two polysilicon structures within the first cell and defining a first pitch wherein the first pillar metal structure and the second pillar metal structure are each single pillar pins and the first pillar metal structure and the second pillar metal structure define a second pitch that is greater than the first pitch by a factor of between 24 and 30.

13. The semiconductor structure of claim 11, further comprising two polysilicon structures within the first cell and defining a first pitch, wherein the first pillar metal structure and the second pillar metal structure each comprise two pillar pins and the pitch of the first pillar metal structure and the second pillar metal structure is greater than the first pitch by a factor of between 48 and 60.

14. The semiconductor structure of claim 7, further comprising:
a fifth supply metal line between the first supply metal line and the third supply metal line;
a first pillar metal structure external to the first cell and coupled to the first supply metal line, the third supply metal line, and the fifth supply metal line; and
a second pillar metal structure external to the first cell and coupled to the first supply metal line, the third supply metal line, and the fifth supply metal line.

15. The semiconductor structure of claim 14, further comprising two polysilicon structures within the first cell and defining a first pitch wherein the first pillar metal structure and the second pillar metal structure are each single pillar pins and the first pillar metal structure and the second pillar metal structure define a second pitch that is greater than the first pitch by a factor of between 24 and 30.

16. The semiconductor structure of claim 15, further comprising two polysilicon structures within the first cell and defining a first pitch, wherein the first pillar metal structure and the second pillar metal structure each comprise two pillar pins and the pitch of the first pillar metal structure and the second pillar metal structure is greater than the first pitch by a factor of between 48 and 60.

17. The semiconductor structure of claim 7, wherein:
the first supply metal line and the third supply metal line are power supply lines or VDD lines,
and the second supply metal line and the fourth supply metal line are ground lines or VSS lines.

18. The semiconductor structure of claim 7, further comprising:
two polysilicon structures within the first cell defining a first pitch;
a first strap structure coupled to the second supply metal line and the fourth supply metal line; and
a second strap structure coupled to the second supply metal line and the fourth supply metal line,
wherein the first strap structure and the second strap structure define a second pitch larger than the first pitch by a factor of between 4 and 30.

19. A method of forming a semiconductor structure, comprising:
forming a first supply metal layer;
forming a first metal pattern layer and a first power route over the first supply metal layer, the first metal pattern layer having a plurality of distinct metal lines and disposed between a first supply metal tract and a second supply metal tract, wherein the first pattern metal layer, the first supply metal tract, and the second supply metal tract are arranged in parallel;
forming a second supply metal layer over the first metal pattern layer; and
coupling a follow pin to both the second supply metal layer and at least one distinct metal line of the plurality of distinct metal lines of the first metal pattern layer.

20. The method of claim 19, wherein the first supply metal layer, the first metal pattern layer, and the second supply metal layer are each formed of a first metal, and the follow pin is formed of a second metal.

* * * * *